(12) United States Patent
Chakravarti et al.

(10) Patent No.: US 7,705,385 B2
(45) Date of Patent: Apr. 27, 2010

(54) SELECTIVE DEPOSITION OF GERMANIUM SPACERS ON NITRIDE

(75) Inventors: Ashima Chakravarti, Hopewell Junction, NY (US); Anthony Chou, Beacon, NY (US); Toshiharu Furukawa, Essex Junction, VT (US); Steven Holmes, Guilderland, NY (US); Wesley Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 546 days.

(21) Appl. No.: 10/905,587

(22) Filed: Sep. 12, 2005

(65) Prior Publication Data

US 2007/0059894 A1 Mar. 15, 2007

(51) Int. Cl.
 *H01L 27/108* (2006.01)
 *H01L 29/76* (2006.01)
 *H01L 29/94* (2006.01)
 *H01L 31/119* (2006.01)
 *H01L 29/00* (2006.01)

(52) U.S. Cl. ........................ 257/299; 257/510; 257/524; 257/288

(58) Field of Classification Search ................. 438/299, 438/611, 612, 613, 614, 304, 503, 305, 674, 438/607; 257/522, 510, 524, 738, 772, 779, 257/780, 781, 737
See application file for complete search history.

(56) References Cited

U.S. PATENT DOCUMENTS

| 5,066,616 | A | * | 11/1991 | Gordon | 430/272.1 |
| 5,282,925 | A | | 2/1994 | Jeng et al. | |
| 5,573,965 | A | | 11/1996 | Chen et al. | |
| 5,679,589 | A | | 10/1997 | Lee et al. | |
| 5,719,424 | A | | 2/1998 | Ahmad et al. | |
| 5,721,443 | A | | 2/1998 | Wu | |
| 5,723,352 | A | | 3/1998 | Shih et al. | |
| 6,027,957 | A | * | 2/2000 | Merritt et al. | 438/106 |
| 6,074,951 | A | | 6/2000 | Kleinhenz et al. | |
| 6,462,414 | B1 | * | 10/2002 | Anderson | 257/738 |
| 6,599,803 | B2 | * | 7/2003 | Weon et al. | 438/300 |
| 6,680,235 | B1 | * | 1/2004 | U'Ren et al. | 438/309 |
| 7,081,404 | B2 | * | 7/2006 | Jan et al. | 438/613 |
| 7,129,585 | B2 | * | 10/2006 | Yoo | 257/778 |
| 7,205,221 | B2 | * | 4/2007 | Akram et al. | 438/612 |
| 7,247,569 | B2 | * | 7/2007 | Boyd et al. | 438/699 |
| 7,338,894 | B2 | * | 3/2008 | Lim et al. | 438/637 |
| 2004/0209406 | A1 | | 10/2004 | Jan et al. | |

FOREIGN PATENT DOCUMENTS

JP 05243593 A 9/2003

* cited by examiner

*Primary Examiner*—Chuong A. Luu
(74) *Attorney, Agent, or Firm*—Gibb I.P. Law Firm, LLC

(57) ABSTRACT

A method of selectively forming a germanium structure within semiconductor manufacturing processes removes the native oxide from a nitride surface in a chemical oxide removal (COR) process and then exposes the heated nitride and oxide surface to a heated germanium containing gas to selectively form germanium only on the nitride surface but not the oxide surface.

17 Claims, 6 Drawing Sheets

SELECTIVE DEPOSITION OF GERMANIUM SPACERS ON NITRIDE

FIELD OF THE INVENTION

The invention generally relates to a method of selectively forming a semiconductor (germanium) structure within semiconductor manufacturing processes that treats a nitride and oxide surface with a chemical oxide removal (COR) process and then heats and exposes the nitride, semiconductor and oxide surface, to a heated semiconductor (germanium) containing gas to selectively form semiconductor (germanium) only on the nitride and semiconductor surface, but not on the oxide surface.

DESCRIPTION OF THE RELATED ART

Standard semiconductor manufacturing processes use combinations of deposited, grown and patterned oxide, nitride and semiconductor along with doping and thermal treatments to form transistors which are subsequently interconnected to form integrated circuits. Selectively deposited or grown structures which utilize combinations of oxide, nitride and semiconductors are of great use in semiconductor manufacturing because selectivity enables construction of self-aligned structures and devices which are free of lithography alignment constraints. Examples of self-aligned structures in wide use for semiconductor manufacturing process are spacers, salicide, source/drain implantation, and raised source-drain. An example of a selectively deposited semiconductor is the raised source/drain.

To improve polysilicon gate field effect transistor (FET) device performance, reducing the effective electrical thickness when the transistor is an inversion mode ($T_{inv}$) has been one of the key drivers of FET drive current improvement together with shrinking the channel length. $T_{inv}$ is comprised of two components, gate dielectric thickness and polysilicon depletion thickness. Until recently, $T_{inv}$ reduction has been successfully pursued by the aggressive reduction of gate dielectric thickness. However, it becomes increasingly more difficult to reduce the gate dielectric thickness below 2 nm because of exponentially increasing gate leakage current from direct tunneling through the thin gate dielectric layer. Increasingly, there is a desire to achieve $T_{inv}$ reduction by reducing the polysilicon depletion thickness to avoid the increase in gate leakage current from gate oxide thickness reduction. Reducing the polysilicon depletion thickness can be achieved by increasing the concentration of doping in the polysilicon gate. However, in a conventional FET fabrication process, simply increasing the dose of the implanted dopants is problematic because the source/drain is doped at the same time as the gate. When the doping in the source drain region becomes too high, the source and drain diffuse towards each other underneath the gate electrode, creating a high leakage device in short channel FET. Therefore, there is a need for new structures and processing methods to improve the performance of field effect transistors.

SUMMARY OF THE INVENTION

One embodiment provides a method of selectively forming a germanium structure that begins with a nitride surface adjacent an oxide surface. The method treats the nitride surface with a chemical oxide removal (COR) process that is substantially free of water. Then, this method exposes the heated oxide and nitride surface to a heated germanium containing gas. During the process of exposing the nitride surface to the heated germanium containing gas, the germanium forms only on the nitride surface and does not form on the oxide surface.

The COR process of treating the nitride surface comprises exposing the wafer surface to a mixture of gaseous HF and $NH_3$. For example, the HF and $NH_3$ flow can be supplied in a flow ratio of 1:10 to 10:1. The gas is supplied at a pressure between 1 to 15 mTorr for between about 5 seconds and about 300 seconds. This COR process removes any native oxide or oxynitride from the nitride surface and leaves the nitride surface in such as state that it can nucleate the subsequent germanium deposition. One feature is that this COR process is a vapor phase process substantially free of water. Water in a liquid or vapor phase can easily reoxidize the nitride surface so minimizing water in this process is advantageous.

After the COR surface treatment is completed, the germanium deposition process is performed by flowing pure germane ($GeH_4$) gas or mixtures of gas containing $GeH_4$ with the wafer heated to an elevated temperature of between 500 C to 900° C. at a pressure from 10 Torr to 300 Torr. The deposition of germanium only nucleates on the exposed nitride surface which has been treated by COR, but not on oxide surfaces. Germane ($GeH_4$) gas may be substituted by dichlorogermane ($GeH_2Cl_2$) or other germanium containing gas.

This produces a germanium structure deposited selectively onto nitride but not oxide. One application of this process is to create a germanium spacer extending from a nitride sidewall spacer. There are oxide surfaces adjacent the nitride sidewall spacer, which will prevent nucleation and deposition of the germanium. For example, the oxide surfaces could be positioned at right angles with respect to the nitride sidewall spacer. The germanium structure (polycrystalline or amorphous germanium) is connected to the nitride sidewall spacer and has a rounded shape determined by the amount of germanium thickness deposited, and the dimensions of the nitride spacer. The germanium structure is not connected to the oxide surfaces. The interface between the germanium structure and the nitride sidewall spacer is free of native oxide. The sides of the germanium structure extend over the oxide surfaces.

The inventive methodology can be utilized to manufacture many different types of structures. For example, the invention can be utilized to create temporary spacers during the formation of field effect transistors. In this method, the invention implants source/drain extension implants into a substrate having patterned gate conductor structures. Next, the invention forms nitride spacers adjacent the gate conductor structures. The native oxide is removed from the nitride surface and then the nitride spacers are exposed to a heated germanium containing gas such as germane ($GeH_4$) to selectively form germanium structures only on the nitride spacers. After this, using the germanium structures as large masking sidewalls, the invention implants source and drain implants into the gate and substrate. Because the wide germanium spacer structure offsets the source and drain implant away from the critical gate and channel region, the implantation dose can be increased to reduce polysilicon depletion in the gate. Then, the germanium structures can be removed and remaining elements of the field effect transistor can be completed.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
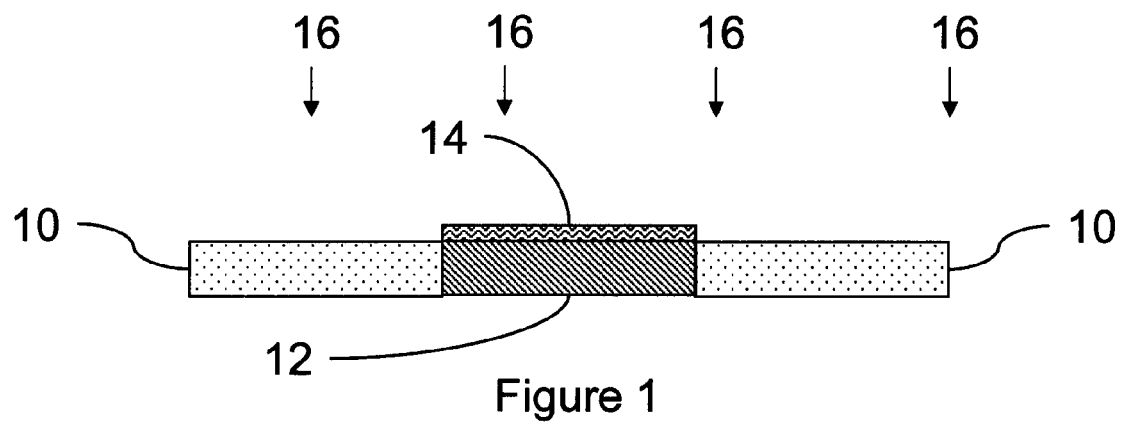
FIG. 1 is a cross-sectional schematic diagram of a partially completed germanium structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention. Semiconductor processing techniques are well known in the art and can be found in many references. By way of example, reference may be had to Silicon Processing For the VLSI Era, Lattice Press 1990; U.S. Pat. No. 5,573,965 to Chen et al, U.S. Pat. No. 5,679,589 to Lee et al, U.S. Pat. No. 5,721,443 to Wu, U.S. Pat. No. 5,719,424 to Ahmad et al and U.S. Pat. No. 5,723,352 to Shih et al, all of which are incorporated herein by reference. The processing techniques and materials mentioned in these and other similar patents demonstrate the level of ordinary skill in this art field. A detailed discussion of such materials and techniques is avoided herein for the sake of brevity and to allow the reader to focus on the salient points of the invention.

The invention described below introduces a methodology of selectively forming a structure that has a generally rounded shape. This structure has a number of uses, and a few examples are mentioned herein. In the examples mentioned below, the rounded structure comprises germanium formed on a nitride. The formation process selectively forms the semiconductor, in this case germanium, on the nitride and not on adjacent oxide materials; however, the invention is not limited only to oxides, nitrides, and germanium, but instead is applicable to any similar materials including silicon, silicon-germanium (SiGe) of varying composition, other semiconductors, and oxynitrides ($SiO_xN_y$).

Figure 2:
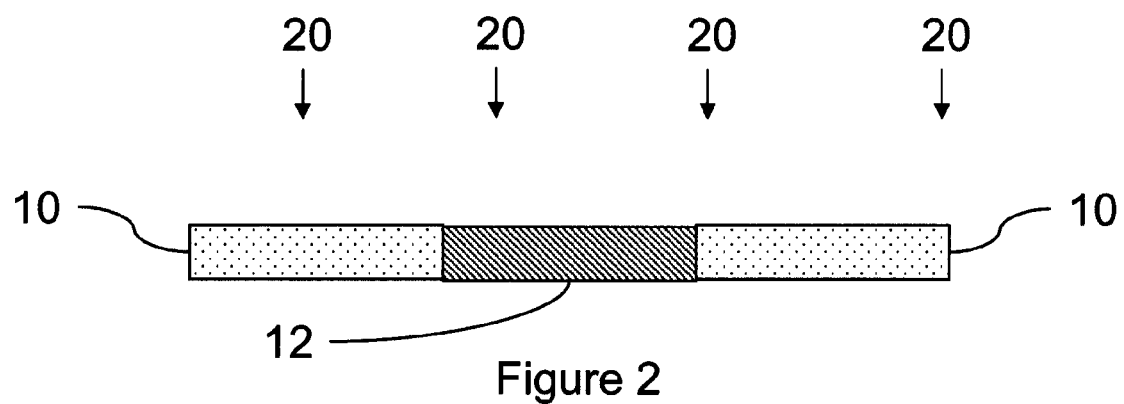
FIG. 2 is a cross-sectional schematic diagram of a partially completed germanium structure.
Figure 3:
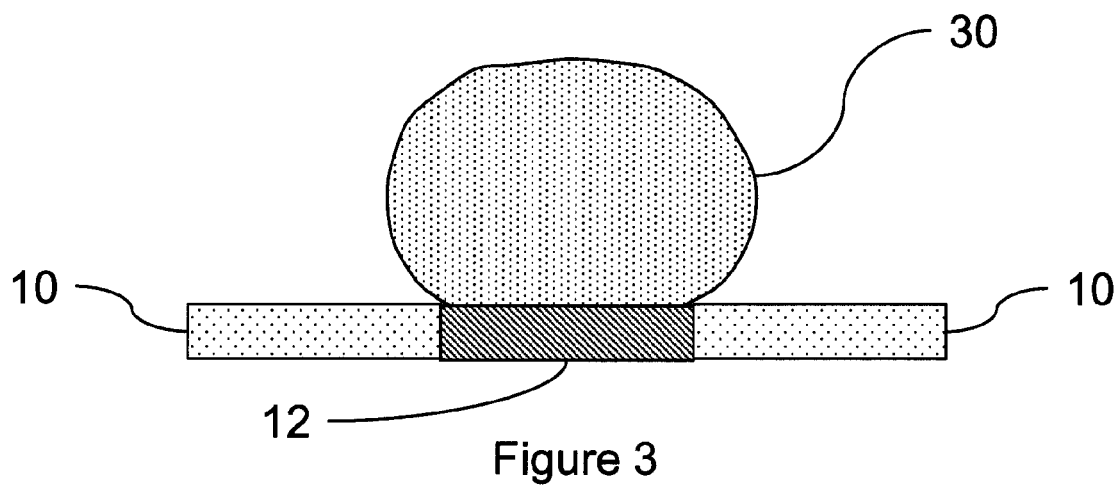
FIG. 3 is a cross-sectional schematic diagram of a partially completed germanium structure.

One embodiment, shown in FIGS. 1-3, provides a method of selectively forming a germanium structure that begins with a nitride surface 12 adjacent one or more oxide surfaces 10. A nitride surface exposed to air will form a thin native oxide, which, if not removed, will inhibit the germanium nucleation and deposition. The method removes the native oxide 14 from the nitride surface 12 in a chemical oxide removal (COR) process (illustrated by arrows 16 in FIG. 1) that is largely free of water. FIG. 2 illustrates the structure after the native oxide 14 is removed. Some of the oxide 10 is also removed by the COR process, so the oxide must be of sufficient thickness to prevent complete removal during the COR process. If the oxide 10 is too thin and the COR completely removes the oxide, the underlying substrate will be exposed, and the germanium deposition will proceed over the exposed substrate in addition to the exposed nitride.

The process of removing of the native oxide 12 comprises exposing the entire surface including the native oxide 12 to a vapor phase etchant, such as a mixture of HF and $NH_3$ gas, ensuring that there is minimal water or moisture present. This process is known as COR, and is disclosed in U.S. Pat. No. 6,074,951 and in U.S. Pat. No. 5,282,925, which is incorporated by reference. A unique and beneficial property of this COR process for this application is that the COR process is diffusion limited. Thus, it can remove precise amounts of oxide in a well controlled manner, which is important to preserve some of the oxide 10. The absence of water in this process is beneficial because water would tend to reform the native oxide on the nitride surface.

Although it is possible to carry out a COR process with flow of water added to the flowing HF and $NH_3$ mixture, it is not advantageous to add a flow of water for this application because it is desirable not to reform the native oxide. The small amounts of water which are produced as a reaction product when the HF and ammonia mixture react with any silicon dioxide is readily pumped out while the HF and $NH_3$ gasses are flowing through the chamber, and therefore does not interfere with preparation of the nitride surface. COR enables preparation of a surface using reactive HF without interference caused by excessive water. Typical flow rates might be 28 to 50 sccm for HF and 14 to 28 sccm for ammonia. As explained in U.S. Pat. No. 6,074,951. The HF: $NH_3$ ratio can range from 1:10 to 10:1, and can be, for example, 2:1. The range of partial pressure for the HF and $NH_3$ combined is from 1 to 15 mTorr, with 6 mTorr being one example. The COR process time is between about 5 seconds and about 300 seconds, but shorter or longer times are possible (such as between about 45 and 180 seconds). The COR can be performed at 23° C., for example, but operation at higher or lower temperatures is also possible.

Then, as shown in FIG. 2, this method exposes the heated oxide surface 10 and the nitride surface 12 which has been treated by COR to a germanium-containing gas such as $GeH_4$ or mixtures of $GeH_4$ with other gases as represented by arrows 20. The germanium deposition can be performed at a temperature ranging from 500° to 900° C., with 590° C. being one example. Temperature will affect the microstructure of the deposited germanium which can vary from amorphous to polycrystalline to crystalline. The pressure for the germanium deposition can range from, for example, 10 Torr to 300 Torr with a pressure of about 160 Torr being one example. The deposition time is selected by the amount of germanium to be deposited and can be from 10 seconds and longer. During the process of exposing the nitride surface 12 to the heated germanium vapor 20, the germanium forms only on the nitride surface 12 which has been pre-treated by COR, and does not form on the oxide surface 10. The GeH$_4$ gas may optionally be mixed with other gases including inert gases such as nitrogen, argon, or complementary reactive gases such as HCl which serves as an etchant and can enhance the selectivity of the process to oxide. SiH$_4$ may also be mixed with GeH$_4$ in varying ratios to deposit SiGe of different composition, or in the extreme case SiH$_4$ alone can be used to deposit polycrystalline or amorphous silicon in place of the germanium previously described.

As shown in FIG. 3, this produces a roundly-shaped bulbous germanium structure 30 (or a rectangular structure having rounded corners) is selectively formed on the nitride surface 12. The germanium structure 30 comprises a polycrystalline and/or amorphous germanium. The germanium structure 30 is only connected to the nitride surface 12 and is not connected to the adjacent oxide surfaces 10. The interface between the germanium structure 30 and the nitride surface 12 is free of native oxide 14. Because of the spherical nature of the structure 30, sides of the germanium structure 30 can extend over the oxide surfaces 10, depending on the thickness of germanium deposited. Should there be an exposed semiconductor surface such as silicon, germanium, or silicon-germanium, the germanium deposition will also nucleate on the exposed semiconductor surface as well. While this feature is not explicitly shown in the examples provided herein, this additional feature would be understood to be useful in constructing other structures and devices.

While the invention is discussed in this disclosure with regard to oxides, nitrides, and germanium structures, one ordinarily skilled in the art would understand that the invention is not limited to these specific examples, but instead the invention is applicable to any structure or process that selectively forms one class of material on a different class of material. Within the art field of integrated circuit devices (and more particularly semiconductor-based integrated circuit devices) materials are generally classified as insulators, conductors, or semiconductors. In the example shown above, the invention begins with a structure that is one class of material and then selectively forms a different class of material on that initial structure. For example, in FIGS. 1-3, the oxide 10 and nitride 12 are both insulators (a first class of material) while the germanium structure 30 is a semiconductor (second class of material). By removing the native oxide 14, the invention is able to form this second class of material 30 selectively on one of the insulators 12 but not on the other insulator 10. Similarly, one ordinarily skilled in the art would understand that insulators could be selectively formed on semiconductors and on conductors, and that conductors could be selectively formed on insulators and on semiconductors, using the same methodology. Further, the invention provides a previously unknown structure where a layer having different types of a first class of material includes a selectively formed second class of material. Therefore, the invention is not limited to the oxides, nitrites, and germanium structures that are shown in the examples, but instead, the invention broadly applies to situations where a second class of material is selectively formed on a layer having different types of a first class of material, where these classes of material can comprise conductors, insulators, and semiconductors.

The uses for such a structure 30 are essentially unlimited. For example, the structure 30 could be used as a support member, an insulator, a sacrificial member, be subsequently doped to form a conductor, or used as part of an electrical device. One of the benefits of the selective deposition of germanium on nitride is that the resulting structure is self-aligned. This is illustrated in FIG. 3 where the germanium is aligned to the nitride surface 12 by the nature of the process itself, which eliminates misalignments from traditional lithography based structure definition. The examples shown in FIGS. 4-11, discussed below, use the structure 30 as a sacrificial spacer 80 (shown in FIGS. 8 and 9) during an impurity implanting process to illustrate one way in which the invention can be used.

Referring now to the example shown in FIGS. 4-11, the invention can be utilized to create temporary spacers during the formation of field effect transistors. This process can be utilized in any type of integrated circuit structure including diodes, bipolar transistors, vertical transistors, planar transistors, etc. This processing begins with the conventional FET gate structure shown in FIG. 4.

Figure 4:
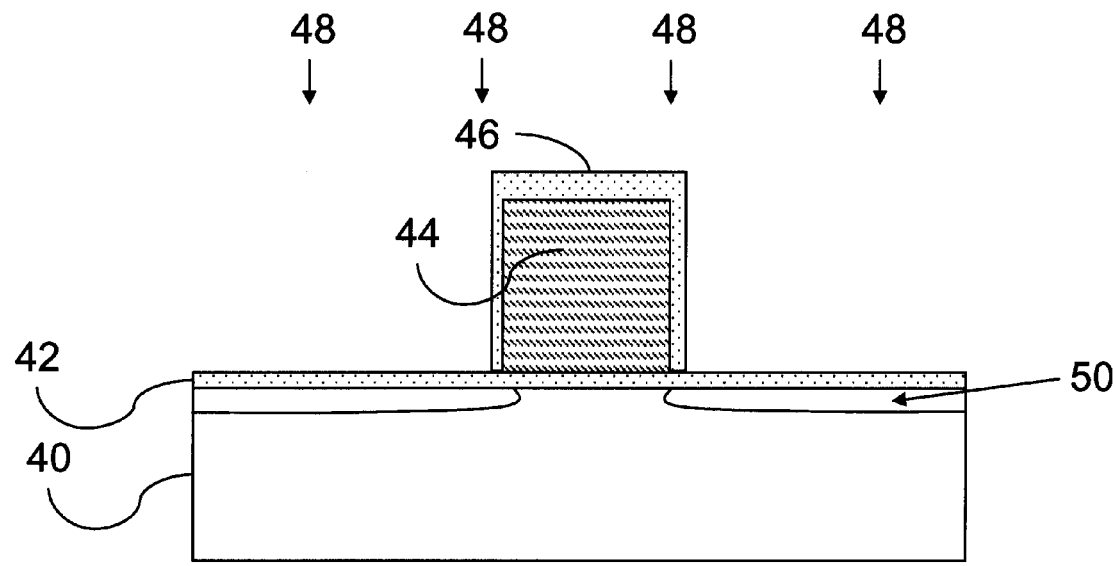
FIG. 4 is a cross-sectional schematic diagram of a partially completed field effect transistor structure.

More specifically, as shown in FIG. 4, using conventional processing, the invention forms a gate insulator layer 42 (such as an oxide layer) on a substrate 40 such as any wafer, etc. that preferably includes an appropriate well implant. Next, a gate conductor 44 is patterned over the gate insulator layer 42 using any conventional deposition and patterning process, such as chemical vapor deposition and photolithography. The gate conductor 44 can comprise any form of conductor now known or developed in the future. One or more insulators and/or caps 46 are formed/grown on the sides and top of the gate conductor 44, the top and side thickness may be different thickness and composition. Item 46 can comprise a single or multiple structures, depending upon the specific device being manufactured, as is well-known by those with ordinary skill in the art. For example, item 46 on the top surface of gate conductor 44 can be the same oxide hard mask used in standard gate conductor patterning. Item 46 on the side of gate conductor can be an oxide formed by the standard poly conductor reoxidation typically done after the poly conductor patterning and etching. Using these particular combinations of processes to create oxide 46 on the top and sides of poly conductor 46 has the advantage of using oxide structures that are already present in standard fabrication process, but other means of generating item 46 are possible. Item 46 on the top of the gate conductor 44 should be made of sufficient thickness to withstand the subsequent COR treatment described below, since the COR treatment will remove a portion of the top surface of item 46. Item 46 on the side of conductor is optional depending on the particular application. Similarly item 42 the oxide on the substrate should also be made of sufficient thickness to withstand the subsequent COR treatment.

Arrows 48 represents an impurity implant that creates a first level of impurity 50, such as source drain extension regions 50. Because this implant is made at the edge of the gate 44, it is generally made shallow to preserve good short channel transistor characteristics, and is the opposite type of dopant relative to the well implant in the substrate. The impurities used for the well implant in the substrate 40 and the extension implants 50 will vary depending upon the type of transistor or structure being manufactured. In addition, the invention is equally useful with well-known processing techniques that simultaneously form complementary type transistors where one type of transistor is protected using a mask, while the other type of transistor receives an impurity implant. To focus the reader on the salient points in the invention, only a single transistor is illustrated in drawings; however, as would be understood by one ordinarily skilled in the art, multiple and different types of transistors (such as complementary transistors) could be simultaneously formed with the invention.

Figure 5A:
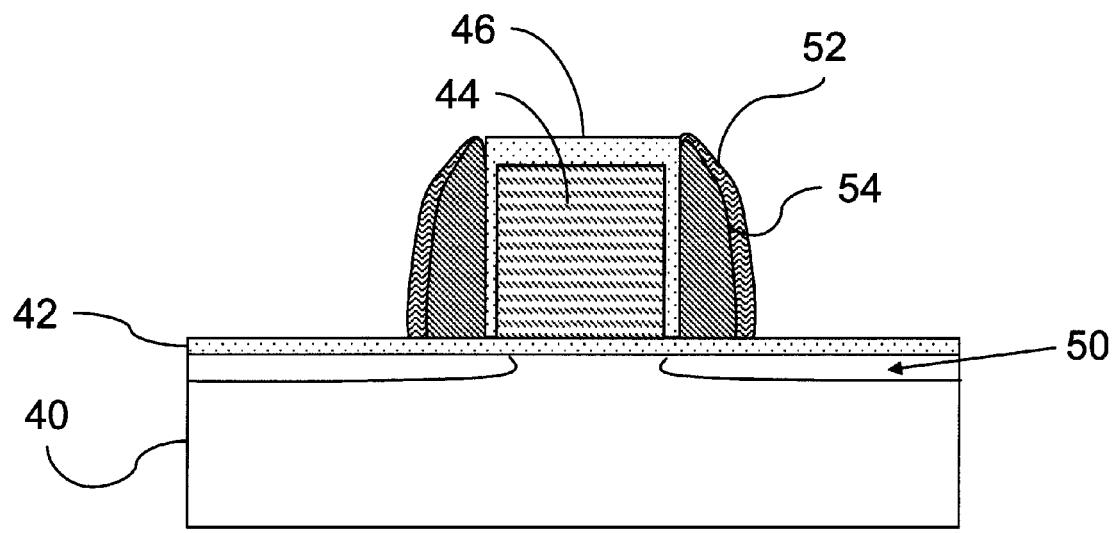
FIG. 5A-5C are cross-sectional schematic diagrams of partially completed field effect transistor structures.

Next, as shown in FIG. 5A, the invention forms sidewall spacers 54 on the insulator 46. The process of forming sidewall spacers is well-known to those of ordinary skill in the art and generally comprises the deposition of a conformal layer followed by a directional etch that removes material from horizontal surfaces at a higher rate than it removes material from vertical surfaces, thereby leaving material on the vertical surfaces and creating sidewall spacers. In this embodiment, the sidewall spacers 54 comprise nitride, however, as mentioned above, different types of materials can be used in place of the nitride. When the spacer 54 is exposed to the ambient, a native oxide 52 naturally forms thereon. The etch to form the sidewall spacer 54 should be performed in such way to avoid too much pull-down of the top of spacer 54 relative to the top surface of the gate conductor 44. As shown in FIG. 5A, the top of the spacer 54 is preferably above the top corner of the gate conductor 44, so that it will protect the corner region of gate conductor 44 from being exposed during the COR treatment. If the sidewall spacer 54 is pulled down below the top edge of the gate conductor 44, then the thickness of item 46 on the sidewall of the gate conductor 44 should be high enough to withstand the COR treatment. It is worth noting that the maximum width of the spacer 54 or any spacer generated by a conventional deposited layer and directional etch is determined by the height of the gate 44, and thus the spacer 54 cannot be made wide enough for many applications. This invention overcomes this problem by creating a spacer that can be made much wider than conventional spacers, as will be described below.

Figure 5B:
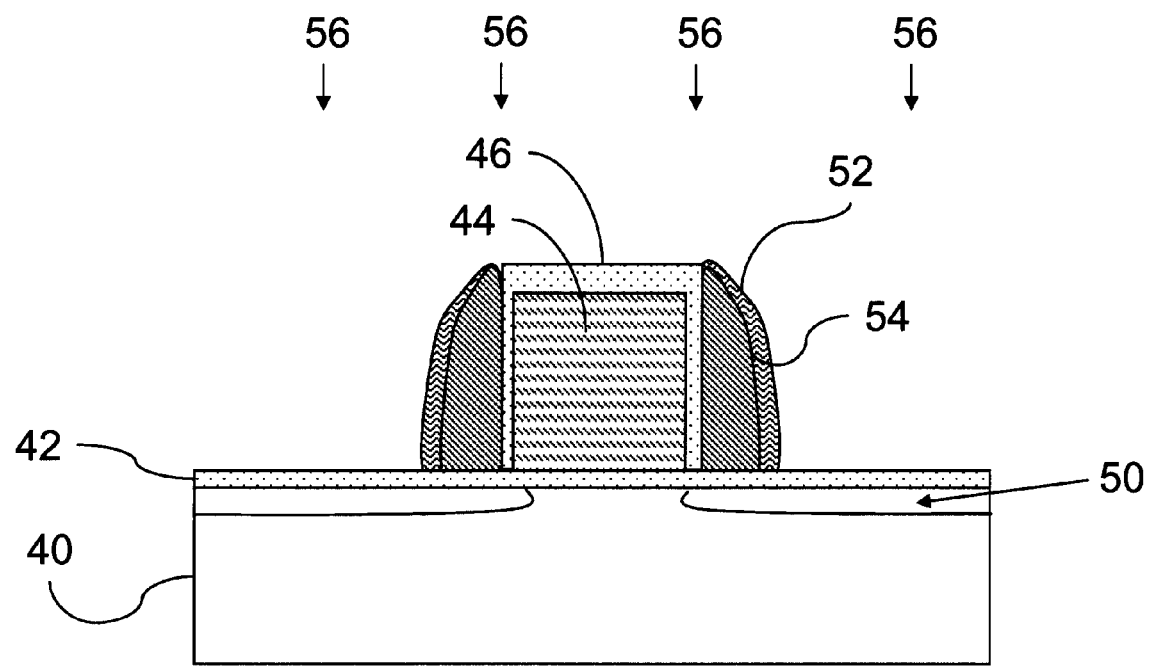
Figure 5C:
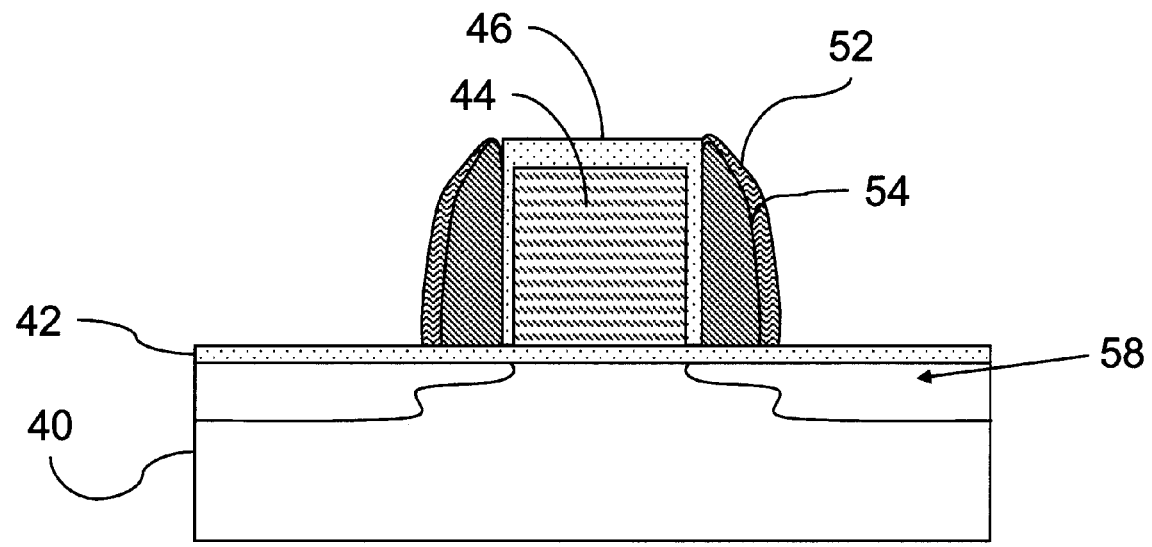

FIGS. 5B-5C illustrate one embodiment where a second impurity implant 56 is performed to create a second layer of impurity 58 within the substrate 40. This implant layer 58 can be deeper and have a higher dose source drain implant than implant 50 because it is offset from the critical channel region by the spacer 54, which maintains good short channel transistor characteristics. As mentioned above, the deeper and higher dose provides for lower resistance which improves transistor drive current. However, the implant should not be made too deep or too high of a dose because the spacer 54 may not be wide enough to prevent the source and drain from becoming too close to each other since the implant layer 58 can diffuse laterally during subsequent heat treatments. Thus, there is a need for a wider spacer, as described below. Alternatively, this second layer of impurity implant can be formed as discussed below with respect to FIG. 10.

Figure 6:
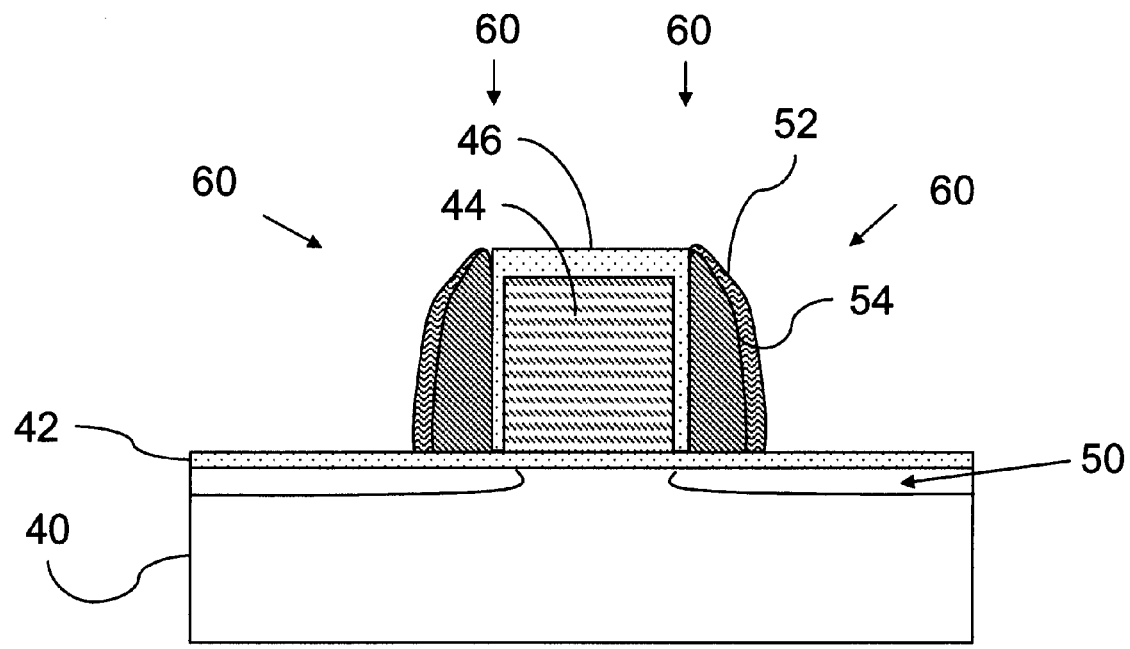
FIG. 6 is a cross-sectional schematic diagram of a partially completed field effect transistor structure.
Figure 7:
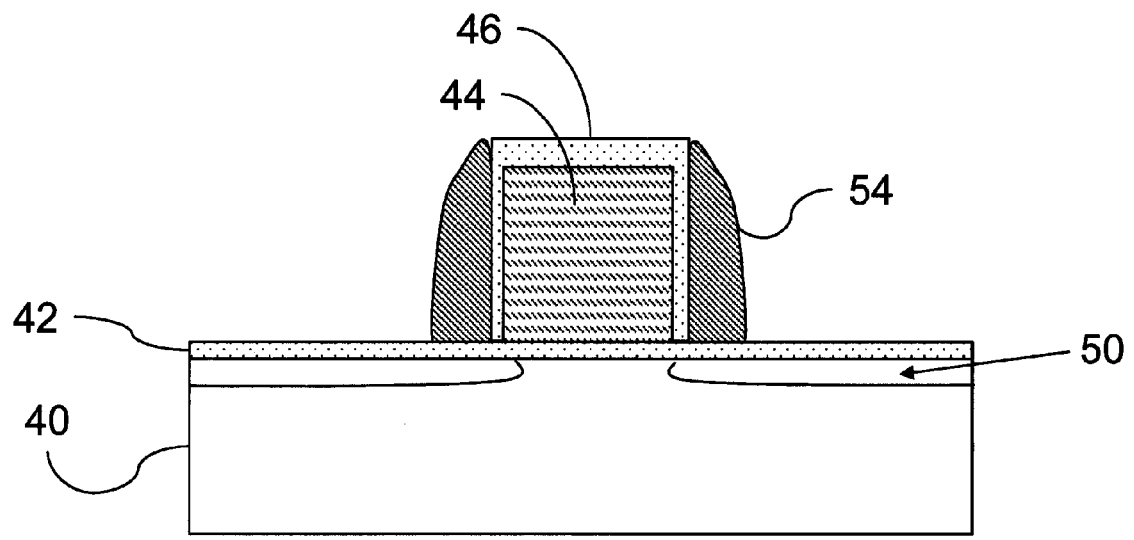
FIG. 7 is a cross-sectional schematic diagram of a partially completed field effect transistor structure.
Figure 8:
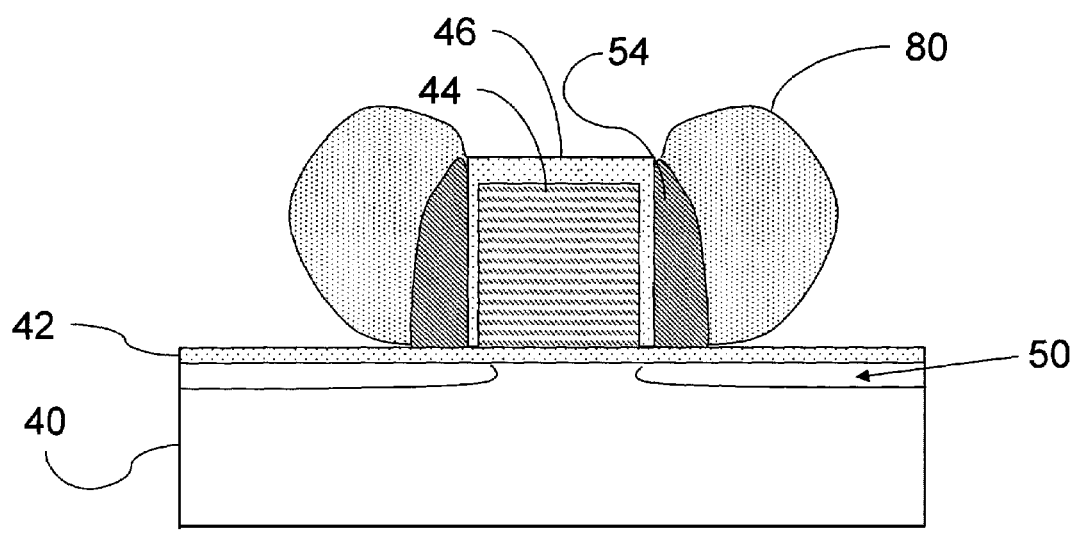
FIG. 8 is a cross-sectional schematic diagram of a partially completed field effect transistor structure.
Figure 9:
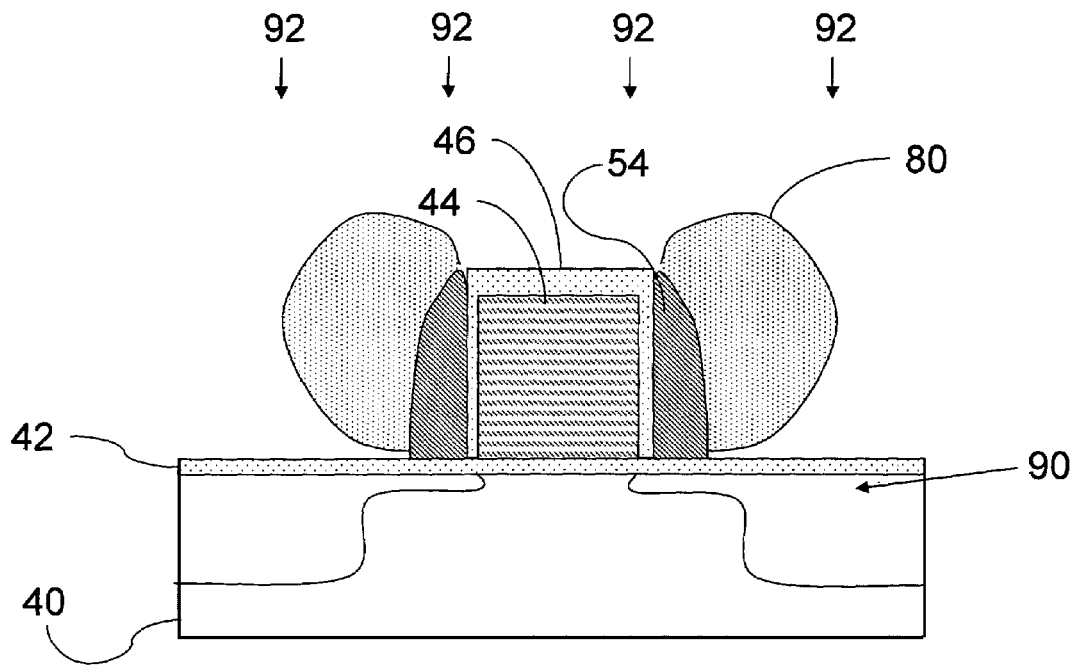
FIG. 9 is a cross-sectional schematic diagram of a partially completed field effect transistor structure.

Using the structure shown in FIG. 5A, processing proceeds as shown in FIG. 6, where the gaseous chemical oxide removal process (that is discussed in detail above) is utilized to remove the native oxide 52 from the sidewall spacers 54. The resulting structure that is free of the native oxide 52 is shown in FIG. 7. Then, as is also discussed in detail above, as shown in FIG. 8, the invention forms the rounded structure 80, which could comprise, for example, germanium, SiGe, or Si. In this example, because of the selective nature of the germanium deposition, the germanium structures 80 only form on the sidewalls 54 and do not form on either oxide 42 or 46 which are the oxide surfaces adjacent the nitride sidewall spacer. In this example, the oxide surfaces are positioned at angles (e.g., right angles) with respect to the nitride sidewall spacer 42. The width of the germanium spacer 80 can be made wider or narrower by increasing or decreasing the deposited thickness. The spacer 80 can be made much wider than a conventional spacer 54 because it is no longer limited by the gate conductor 44 height.

After this, using the germanium structures 80 as large masking sidewalls, the invention performs another impurity implant 92 into the gate conductor 44 to form additional source and drain implants 90 in the substrate 40. The spacer 80 is made very wide so the implant into the substrate 40 is widely offset from the gate conductor 44, which avoids the degradation of short channel transistor characteristics for high dose impurity implant 92. Thus the doping level in the gate conductor 44 can be increased to appropriate levels to reduce polysilicon depletion thickness and thus achieve lower $T_{inv}$. Note that this lower $T_{inv}$ can be achieved without decreasing the gate oxide thickness which comes with the penalty of increased gate oxide leakage current.

Figure 10:
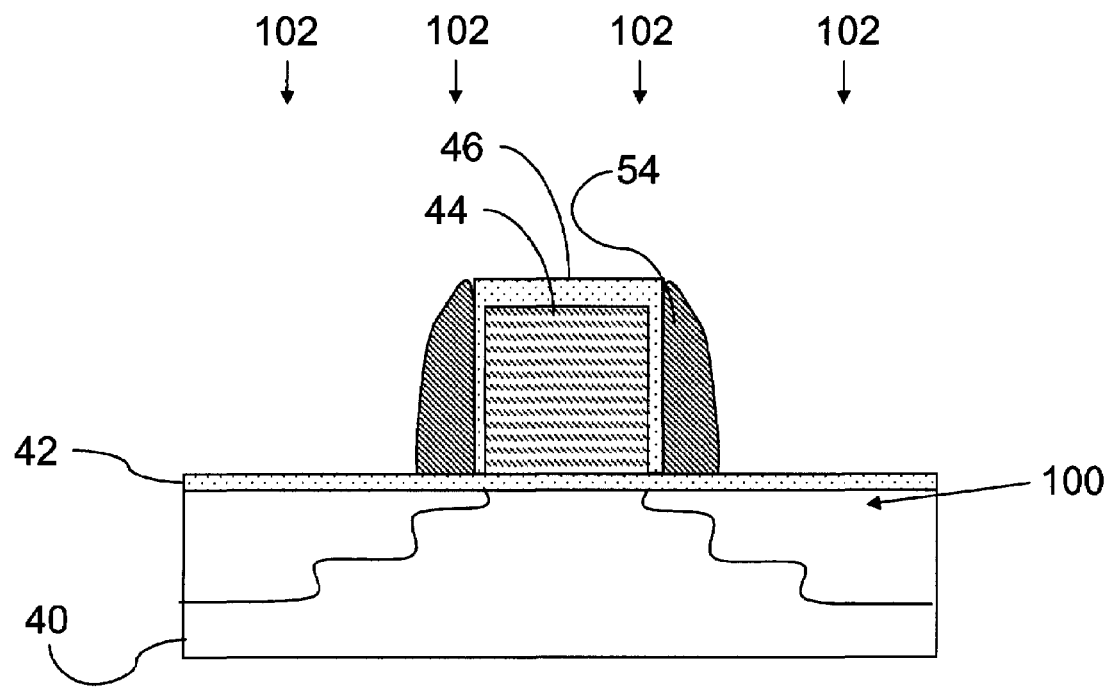
FIG. 10 is a cross-sectional schematic diagram of a partially completed field effect transistor structure.
Figure 11:
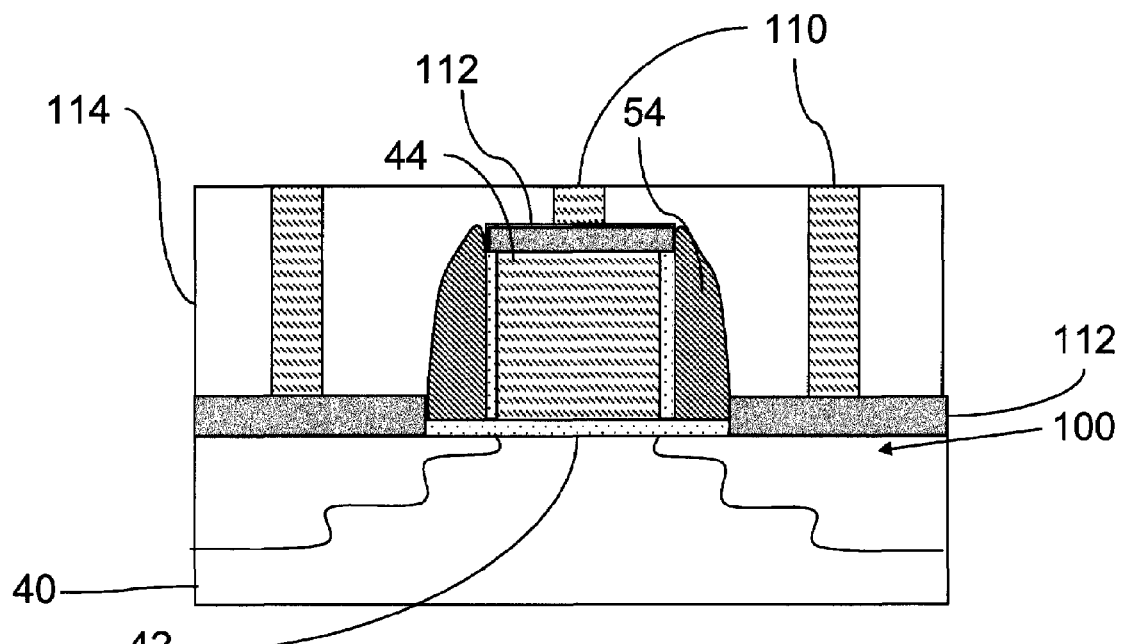
FIG. 11 is a cross-sectional schematic diagram of a partially completed field effect transistor structure.

Then, as shown in FIG. 10, the germanium structures 80 can optionally be removed using any selective material removal process, such as rinsing in a hydrogen peroxide and water mixture. Such a material removal process would not affect the remaining structures, but will remove the germanium structure 80. Even though a germanium composition is described for structures 80, other compositions such as SiGe, Si, or other materials are possible. Germanium is particularly convenient because it can be easily removed by a mixture of hydrogen peroxide and water, which does not affect the remaining structures. Then, if the processing shown in FIGS. 5B-5C has not been performed, an additional implant 100 is formed by implanting and additional impurity 102. Following this, as shown in FIG. 11, well-known processing steps including activation anneal of the dopants in source/drain and in the gate conductor, formation of suicides 112, deposition and planarization of insulator 114, and formation of contacts 110 and wiring are performed to complete the structure.

Therefore, the invention implants source/drain extension implants into a substrate around the patterned gate conductor structures. The invention forms nitride spacers adjacent the gate conductor structures. The native oxide is removed from the nitride surface, and then the heated wafer including the nitride spacers, are exposed to a heated germanium vapor to selectively form germanium structures only on the nitride spacers. After this, using the germanium structures as large masking sidewalls, the invention implants source and drain implants into the substrate. The germanium structures can optionally be removed, and remaining elements of the field effect transistor can be completed.

Thus, as shown above, the invention presents a novel rounded structure that has a number of uses. For example, the invention allows a very large sacrificial spacer to be utilized during source/drain impurity implant processing during field effect transistor manufacturing. This overcomes conventional manufacturing problems associated with increasing the gate and source/drain implantation dose concurrently. There is a significant benefit to increasing the gate conductor implantation dose because the higher doping levels can reduce the poly depletion thickness, which in turns reduces $T_{inv}$ thickness without having to decrease the gate oxide thickness or increase the gate oxide leakage. However, in a typical semiconductor manufacturing process, because the gate conductor and source/drain receive the same implantation dose, the upper implantation dose is typically limited by the dose that the source/drain can withstand, which prevents the lowest value of $T_{inv}$ from being achieved. The source/drain implantation cannot be too high because in short channel devices, the lateral implantation straggle and lateral diffusion of source/drain doping towards each other causes severe short channel degradation, which leads to highly leaky FET devices. This invention utilizes a sacrificial germanium spacer to overcome this limitation by effectively decoupling the gate implantation from the source/drain implantation near the critical channel region. The gate implantation dose can be increased without negative impact to the FET source/drain characteristics, because this novel sacrificial germanium spacer can be made substantially wider than conventional spacer formed by conformal deposition and directional etching. The wide nature of this spacer offsets the implantation into the substrate far enough from the gate so that the FET will not suffer any short channel degradation, yet the gate doping level can be increased to reduce $T_{inv}$.

While the invention has been described in terms of preferred embodiments, those skilled in the art will recognize that the invention can be practiced with modification within the spirit and scope of the appended claims.

What is claimed is:

1. A semiconductor structure comprising:
   a first insulator surface having two laterally disposed sides;
   second insulator surfaces adjacent to and in lateral contact with lower vertical edges of each of said first insulator surface two sides; and
   a bulbous semiconductor structure comprising a semiconductor material deposited directly on said two laterally disposed sides of said first insulator surface,
   wherein said semiconductor structure is free from any connection to said adjacent second insulator surfaces,
   wherein an interface between said semiconductor structure and said first insulator surface is free of native oxide.

2. The structure in claim 1, wherein said semiconductor structure comprises silicon germanium.

3. The structure in claim 1, wherein said semiconductor structure comprises germanium.

4. The structure in claim 1, wherein sides of said semiconductor structure extend over said second insulator surfaces.

5. A germanium structure comprising:
   a nitride sidewall spacer having a first side;
   an oxide surface adjacent to and in contact with said first side at a lower vertical edge of said nitride sidewall spacer, wherein said oxide surface is positioned at an angle with respect to said nitride sidewall spacer; and
   a bulbous germanium structure comprising a semiconductor material deposited directly on said first side of said nitride sidewall spacer,
   wherein said germanium structure is not formed on said oxide surface,
   wherein said angle that said oxide surface is positioned at with respect to said nitride sidewall spacer is approximately an orthogonal angle, and
   wherein said bulbous germanium structure extends in a direction of said orthogonal angle.

6. The structure in claim 5, wherein said germanium structure comprises silicon germanium.

7. The structure in claim 5, wherein said germanium structure comprises germanium.

8. The structure in claim 5, wherein an interface between said germanium structure and said nitride sidewall spacer is free of native oxide.

9. The structure in claim 5, wherein sides of said germanium structure extend over said oxide surfaces.

10. A semiconductor structure comprising:
    a first insulator surface;
    second insulator surfaces coplanar with and contacting said first insulator surface, said first insulator surface being between said second insulator surfaces; and
    a bulbous semiconductor structure comprising a semiconductor material deposited directly on said first insulator surface,
    wherein said semiconductor structure does not contact said second insulator surfaces,
    wherein an interface between said semiconductor structure and said first insulator surface is free of native oxide.

11. The structure in claim 10, wherein said semiconductor structure comprises silicon germanium.

12. The structure in claim 10, wherein said semiconductor structure comprises germanium.

13. The structure in claim 10, wherein sides of said semiconductor structure extend over said second insulator surfaces.

14. The structure in claim 10, wherein said semiconductor structure comprises a doped silicon material.

15. The structure in claim 1, wherein said semiconductor structure comprises a doped silicon material.

16. The structure in claim 7, wherein said germanium structure comprises a doped silicon material.

17. The structure in claim 1, wherein said bulbous semiconductor structure extends in a direction beyond said two laterally disposed sides of said first insulator.

* * * * *